(12) United States Patent
Landesberger et al.

(10) Patent No.: US 7,027,283 B2
(45) Date of Patent: Apr. 11, 2006

(54) MOBILE HOLDER FOR A WAFER

(75) Inventors: Christof Landesberger, Munich (DE); Armin Klumpp, Munich (DE); Martin Bleier, Munich (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 199 days.

(21) Appl. No.: 10/343,688

(22) PCT Filed: Jul. 30, 2001

(86) PCT No.: PCT/EP01/08822

§ 371 (c)(1),
(2), (4) Date: Jun. 10, 2003

(87) PCT Pub. No.: WO02/11184

PCT Pub. Date: Feb. 7, 2002

(65) Prior Publication Data

US 2004/0037692 A1  Feb. 26, 2004

(30) Foreign Application Priority Data

Aug. 2, 2000  (DE) ............................... 100 38 052

(51) Int. Cl.
*H01T 23/00* (2006.01)

(52) U.S. Cl. ...................................... 361/234; 361/230

(58) Field of Classification Search ................ 361/230, 361/231, 232, 233, 234

See application file for complete search history.

(56) References Cited

U.S. PATENT DOCUMENTS

| | | | |
|---|---|---|---|
| 4,554,611 A * | 11/1985 | Lewin | 361/234 |
| 4,665,463 A * | 5/1987 | Ward et al. | 361/234 |
| 4,733,632 A | 3/1988 | Ohmi et al. | |
| 5,583,736 A | 12/1996 | Anderson et al. | |
| 5,864,459 A * | 1/1999 | Lu et al. | 361/234 |
| 5,953,200 A * | 9/1999 | Haley et al. | 361/234 |
| 6,071,630 A * | 6/2000 | Tomaru et al. | 428/627 |
| 6,281,469 B1 * | 8/2001 | Perrin et al. | 219/121.43 |

FOREIGN PATENT DOCUMENTS

| | | |
|---|---|---|
| DE | 19962763 | 12/1999 |
| EP | 0138254 | 6/1988 |
| EP | 0506537 | 9/1992 |
| EP | 0552877 | 7/1993 |
| FR | 2 774 807 | 9/1999 |
| JP | 59132139 | 7/1984 |
| JP | 5315429 | 11/1993 |
| JP | 9162272 | 6/1997 |

OTHER PUBLICATIONS

Choudhury et al. "Copyright Protection for Electronic Publishing Over Computer Networks" May/Jun. 1995. IEEE Network.

* cited by examiner

*Primary Examiner*—Brian Sircus
*Assistant Examiner*—Danny Nguyen
(74) *Attorney, Agent, or Firm*—Michael A. Glenn; Glenn Patent Group

(57) ABSTRACT

The present invention provides a mobile holder for a wafer, which comprises a base element, a first fixing means and a second fixing means. The first fixing means is configured to allow a wafer to be fixed to the base element. The second fixing means is configured to fix the mobile holder to a support for said mobile holder.

14 Claims, 1 Drawing Sheet

MOBILE HOLDER FOR A WAFER

FIELD OF THE INVENTION

The present invention relates to the field of holding devices for wafers and especially to the field of electrostatic holding devices for wafers.

BACKGROUND OF THE INVENTION AND PRIOR ART

In the production of many semiconductor components, the handling of a wafer represents an important factor for a successful production process. The production of chip cards and thin integrated circuits, for example, necessitates that very thin wafers are handled, which have to be transported and held without the risk of breaking.

Many semiconductor processes, such as the production of circuit elements for power electronics, additionally require back-surface processes, which comprise a deposition of solder or alloy layers on the back of the fully processed circuit wafer; in a subsequent alloying or sintering step of these layers, high temperatures occur, which may exceed 400° C. The wafer holding device must then guarantee perfect functioning in the case of these ambient temperatures.

A known method of handling thin wafers is so conceived that the front face of the wafer is provided with a protective foil, which is typically a polymer foil. The wafer is held by the carrier foil during the thinning sequence. The possibility of using this known method comprises wafers having a diameter of 6 inches and a thickness which must not exceed 100 µm. Handling and transport of wafers having a thickness of less than 100 µm is prevented by the fact that the wafers will bend, whereby the risk of breaking increases significantly for the thin wafers. It follows that the method does not offer any possibility of handling extremely thin wafers with comparatively large diameters.

Another method makes use of a carrier wafer to which the wafer to be thinned is reversibly attached by means of an adhesive film which is adherent on both sides, e.g. a thermally strippable film. The thermally strippable film can be stripped by subjecting it to a certain temperature. The method is adapted to be used for wafers having a thickness of not less than 20 µm, and also wafers having a large diameter can be held safely. The method is, however, disadvantageous insofar as, due to the adhesive film used, which is typically a polymer film, the method is not suitable for back-surface processes involving temperatures above 130° C.

Furthermore, electrostatic holding devices, so-called electrostatic chucks, are known for taking up wafers by means of electrostatically generated holding forces and for holding these wafers during a production process. The holding force can be generated by means of a monopolar electrode or by means of bipolar electrodes. In the case of a monopolar electrode, the wafer to be held serves as a counterelectrode and must therefore be connected to ground; during a dry etching process, for example, this connection to ground is obtained by the conductive etch plasma.

The known electrostatic holding devices are, however, disadvantageous insofar as they have a solid structural design and are, typically, fixedly installed in a processing chamber. In addition, the known electrostatic holding devices are dependent on an external power supply. Hence, the known electrostatic holding devices can only be used as holding devices for holding the wafer at one location, but they cannot be used for the purpose of transport, e.g. for taking up a thinned wafer at the location where the thinning sequence has been executed and transporting it to a second location where e.g. processing of the back surface will take place.

It follows that the handling of thin wafers, which necessitate high-temperature processing steps, such as sintering or alloying, is problematic, since devices for handling such wafers are not available.

Furthermore, a support device is, at present, not available, which permits chips that have been subjected to a dicing process of the type described e.g. in DE-19962763 A1 to be taken up and detached selectively.

EP 0 552 877 A1 discloses an electrostatic chuck and a method of exciting the same. The electrostatic chuck is part of a multi-chamber system for processing integrated circuits. A wafer transport plate supports a wafer by means of an electrostatic holding device. The wafer transport plate itself is connected to a base of the multi-chamber system by a four-bar connecting joint in such a way that the wafer can be moved to and fro between various chambers by displacing and rotating the wafer support plate. The electrostatic holding device comprises a dielectric base layer having arranged thereon electrode strips which are incorporated in a dielectric encapsulating layer. The dielectric base layer is formed on the upper surface of the wafer support plate making use of conventional deposition, masking and etching steps.

EP 0 506 537 A1 discloses an electrostatic chuck comprising an integral five-layer structure, which is suitable for holding and transporting a semiconductor silicon wafer in a production process for electronic components. A particularly characteristic feature of this electrostatic chuck is that the wafer held will be released immediately when a voltage applied to electrodes of the chuck is switched off. It is the object of the present invention to provide a concept for an improved handling of wafers.

SUMMARY OF THE INVENTION

In accordance with a first aspect of the invention, this object is achieved by a mobile holder for a wafer, comprising: a base element; a first fixing means for electrostatically fixing the wafer to the base element, said first fixing means comprising a functional layer and an electrode structure which is arranged between said functional layer and said base element, wherein the functional layer is formed such that the first fixing means is in an electrostatically active state without any supply of voltage from outside;and a second fixing means for releasably fixing the mobile holder to a wafer support.

In accordance with a second aspect of the invention, this object is achieved by a method of handling a wafer comprising the following steps: providing a mobile holder for a wafer, said mobile holder comprising a base element, a first fixing means used for electrostatically fixing the wafer to the base element and including a functional layer which is implemented such that said first fixing means is in an electrostatically active state without any supply of voltage from outside, and a second fixing means for releasably attaching the mobile holder to a wafer support; fixing the mobile holder to a wafer support with the aid of the second fixing means; attaching a wafer to the base element with the aid of the first fixing means; moving the mobile holder from a first location to a second location; and detaching the wafer from the mobile holder by actuating the first fixing means.

The present invention is based on the finding that a holder for a wafer can be provided in that a first fixing means is used for fixing a wafer to the holder, whereas a second fixing means is used for connecting the holder to a support for the mobile holder.

One advantage of the present invention is that the holder can be attached to a movable support so that the holder is mobile.

Another advantage of the present invention is that various types of supports can easily be used for the mobile holder.

A preferred embodiment of the present invention comprises a mobile holder with a flat base element comprising a circular silicon wafer. On the front face of the base element an insulating layer is formed which has, in turn, formed thereon a first electrode and a second electrode in spaced relationship with one another. The insulating layer consists of an electrically insulating material, such as silicon oxide. The electrodes are provided with respective connecting areas so that they can be connected to electric leads. The mobile holder is additionally provided with a functional layer arranged over the full area of the first electrode and of the second electrode and consisting of a material which contains movable ions. In the preferred embodiment, the functional layer allows the mobile holder to be in an active state without being connected to an external voltage source. On top of the insulating layer a cover consisting of an insulating material, such as silicon oxide, silicon nitride or silicon carbide, is formed as a protective layer over the full area of the insulating layer.

In an alternative embodiment, the mobile holder comprises an active layer consisting of a material having a high dielectric constant.

In a further embodiment, the mobile holder has a matrix electrode structure in which individual electrodes can be controlled purposefully and supplied with voltages so as to permit a pixelwise removal of chips.

Furthermore, another embodiment is provided with feed-through leads for the first electrode and the second electrode, which extend through the base element so as to permit a connection of the electrodes from the back of the base element.

In one embodiment, the second fixing means constitutes the area of the back of the mobile holder. In this embodiment, the support for the mobile holder is a conventional vacuum wafer chuck, the mobile holder being attached to the vacuum wafer chuck by a vacuum applied between the second fixing means and a fixing area of the wafer chuck.

In a further embodiment, the second fixing means is a margin of the mobile holder. In this embodiment, an attachment of the mobile holder to a known support is achieved in that the support mechanically grips the mobile holder on the margin thereof.

Furthermore, in the case of still another embodiment, the edge of the mobile holder constitutes the second fixing means, a known support fixing the mobile holder by mechanically gripping the mobile holder at the edge thereof.

BRIEF DESCRIPTION OF THE DRAWINGS

In the following, preferred embodiments of the present invention will be explained in detail making reference to the drawings enclosed, in which.

DETAILED DESCRIPTION OF PREFERRED EMBODIMENTS

Figure 1:
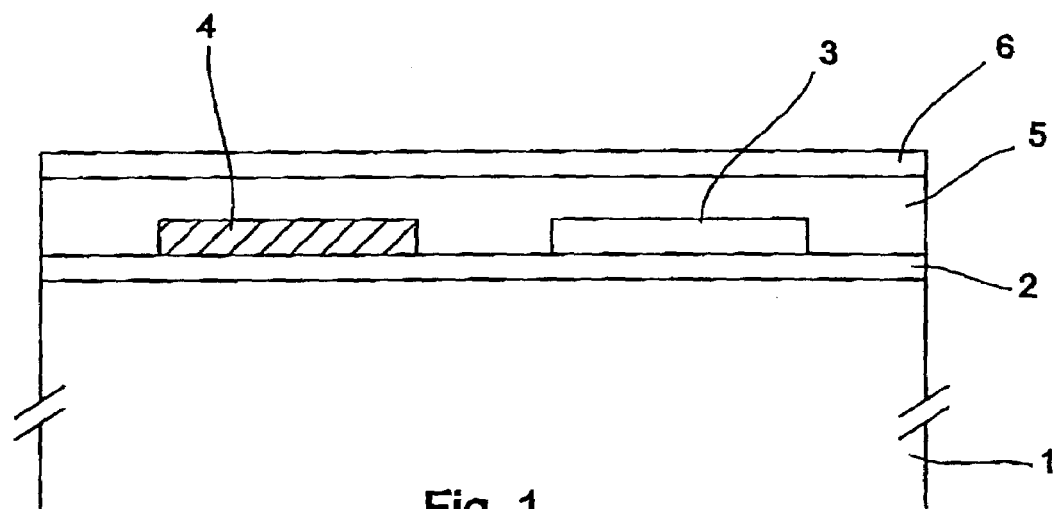
FIG. 1 shows a cross-sectional view of a mobile holder according to one embodiment of the present invention.

According to FIG. 1, a mobile holder comprises a flat, circular base element 1 having an insulating layer 2 formed on the front face thereof. The insulating layer 2 consists of an electrically insulating material such as silicon oxide or silicon nitride. A first electrode 3 and a second electrode 4 are arranged on the insulating layer 2 in spaced relationship with one another. The first electrode 3 and the second electrode 4 preferably consist of a temperature-resistant electric conductor, such as a metal having a high melting temperature, and are identical in area, as will be explained in the following with reference to FIG. 2.

The base element 1, which preferably consists of a semiconductor material, ceramics such as $ALO_2$, Kapton or SiC, has a diameter which is equal to the diameter of a wafer to be held or which is slightly larger than the wafer to be held. In, a specially preferred embodiment, the base element 1 is formed such that it has a diameter of approx. 150 mm and a thickness of approx. 680 µm; this corresponds to typical dimensions of a standard wafer.

Due to the use of temperature-resistant materials for the base element 1, the mobile holder is suitable for high ambient temperatures so that the mobile holder is suitable for holding process wafers during temperature-critical processes, such as an alloying or sintering of metal layers.

Silicon and other semiconductor materials show at high temperatures an increase in their intrinsic conductivity, which causes a deterioration of the electrostatic holding force in the case of the voltages applied to the electrodes, which are in the range of from 1,000 V to 2,000 V. In processes involving high temperatures, e.g. in plasma processes, ceramics and in particular SiC are preferred to semiconductor materials as a material for the base element 1; due to the high thermal conductivity, SiC additionally guarantees that the wafer to be held is well cooled in an advantageous manner. SiC has the further advantage that the expansion coefficient does not essentially differ from that of silicon so that, especially in cases in which the wafer to be held consists of silicon, a use of SiC as a material for the base element 1 will be advantageous.

The mobile holder additionally includes a functional layer 5 which is arranged on top of the first electrode 3 and the second electrode 4 and in the spaces between these electrodes and which extends over the whole surface of the wafer as a continuous layer. In the preferred embodiment the functional layer 5 consists of a material containing movable ions, such as borosilicate glass, or of a material having a high dielectric constant, such as barium titanate, strontium titanate.

On top of the electrically insulating layer 5 a cover 6 consisting of an insulating material, such as silicon oxide or silicon nitride, is formed over the full area of the insulating layer 5. The cover serves to protect the functional layer 5 arranged therebelow against aggressive chemical substances.

Figure 2:
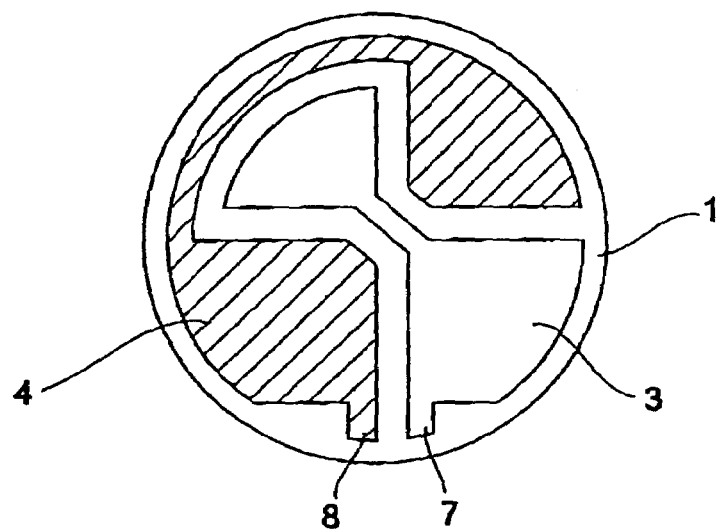
FIG. 2 shows a top view of a mobile holder according to one embodiment of the present invention.

FIG. 2 shows a top view of the mobile holder shown in FIG. 1, FIG. 1 and FIG. 2 being not represented on the same scale. As can be seen in FIG. 2, the first electrode 3 has a first connecting area 7 and the second electrode 4 has a second connecting area 8, each of these connecting areas being arranged in the vicinity of the edge of the mobile holder. The connecting areas 7 and 8 permit an electric voltage to be applied the respective associated electrodes. The arrangement of the connecting areas in the vicinity of the edge of the mobile holder allows an exposed mode of arrangement of these connecting areas when a process wafer is attached, in that said process wafer is attached to the mobile holder in such a way that the flat portion of the wafer is located in the region of the connecting areas. The term flat portion describes a portion in which the edge of the wafer, instead of following a circular-arc shape, follows a straight line of a segment portion so as to indicate the direction of crystal growth. It follows that, in this embodiment, electric leads for the connecting areas can be fixed to the front face of the mobile holder.

In an alternative embodiment, feed-through leads for the first electrode 3 and the second electrode 4 extend through the base element 1 so that, by means of connecting areas formed on the back of the base element 1, the electrodes can be electrically connected to leads. Leads extending through the base element have the advantage that the process wafer can be positioning independently of the position of the flat.

In the embodiment shown in FIG. 2, the first electrode 3 and the second electrode 4 are, in addition, arranged in such a way that the electrode 3 is essentially arranged in a first quarter circular segment of the circle area of the base element 1 and in a second quarter circular segment located in diagonally opposed relationship with the first one, the electrode portions arranged in these quarter circular segments being interconnected by a bridge which extends through the centre of the circle area of the base element 1. Furthermore, the electrode 4 according to FIG. 2 is essentially formed in the quarter circular segments in which the electrode 3 is not arranged. The two diagonally opposed quarter circular segment portions of the electrode 4 are interconnected via an elongate, curved connection area extending along the edge of the base element 1.

The first electrode 3 and the second electrode 4 are arranged in such a way that they are spaced apart by an elongate interspace having an essentially constant width. Furthermore, the electrodes 3 and 4 are spaced from the edges of the base element 1 in such a way that a margin is formed between the electrodes 3 and 4 and the edge of the base element 1, said margin being adapted to be used as a holding device for attaching the mobile holder to a support.

For attaching a wafer to be held, e.g. a very thin process wafer (20–100 µm), the front face of the mobile holder must be brought into contact with or into close proximity to the side of the wafer to be held at which the holder is to be attached.

In order to move the mobile holder to the take-up location, said mobile holder is first fixed to a wafer support, e.g. a robot wafer support. In a preferred embodiment, the margin formed between the electrodes and the edge of the wafer serves as a fixing means for fixing the wafer support; in this embodiment, the mobile holder has a slightly larger diameter than the wafer to be supported so that the process wafer to be taken up does not project into the marginal area of the mobile holder and can be fixed without any disturbance by an attachment means fastened to the margin of the mobile holder. The mobile holder can be fixed to an attachment means of the wafer support through pressure contact or in some other suitable way, such as reversible bonding.

In a further embodiment, the edge of the base element 1 represents the fixing means for attaching the mobile holder to a wafer support. In this embodiment, the mobile holder is only held by pressure contact between an attachment means of the wafer support and the edge of the mobile holder.

Furthermore, in another embodiment the back of the mobile holder may have the function of a fixing means for attaching a wafer support. Alternatively, the mobile holder can also be transferred to a stationary chuck, such as an electrostatic chuck, said chuck being secured to the back of the mobile holder.

For facilitating a transfer of the mobile holder, said mobile holder may additionally be provided with suitable adjustment and sensor elements.

As has already been mentioned, the shape and the size of the mobile holder are preferably of such a nature that said mobile holder differs only insignificantly from a standardized shape and size for process wafers; even wafers having a large diameter and a small thickness can be held easily by the mobile holder. The standardized shape of the mobile holder makes it possible that the mobile holder can be stored in standardized storage devices for wafers, e.g. in racks or hurdles, and that it can be taken up from said racks by standard wafer supports, such as robot handling devices, and transported to desired locations. In view of the fact that it is possible to use the holding and gripping devices provided as part of the standard equipment in the field of semiconductor production, the mobile holder according to the present invention represents a reasonably-priced system, which, in addition, can easily be attached to an arbitrary type of wafer support, a circumstance which essentially facilitates integration in a semiconductor production process.

When the mobile holder has been fixed to the wafer support, the mobile holder can be moved by means of said wafer support to the process wafer to be held.

In order to make it possible that the wafer to be held is held on the mobile holder, the mobile holder must be in an activated state in which the electrodes 3 and 4 have applied thereto opposite voltages which are sufficiently high for fixing a wafer. Due to the provision of the functional layer 5, the mobile holder is implemented such that it will maintain an activated state also without any external voltage source. This is achieved by the use of suitable materials for the functional layer 5. The material employed so as to be able to use the functional layer 5 as a storage layer for storing electrostatic charges in an activated state is preferably a dielectric material with movable ions, such as borosilicate glass, which contains movable sodium and potassium ions. Alternatively, a material having a high relative dielectric constant can be used.

The use of the above-mentioned materials allows a quasi-permanent charge shifting according to the known capacitor effect. The mobile holder is only connected to an external voltage source for the purpose of charging and is in an activated state also after having been separated from the external voltage source; in this activated state, a voltage which is sufficiently high for holding the process wafer is applied between the first electrode 3 and the second electrode 4. In the case of prolonged holding times, the mobile holder can be connected via the connecting areas 7, 8 to the external voltage source for the purpose of "refreshing" the charges.

In the activated state, an electric field is produced by the oppositely charged electrodes 3 and 4, said electric field causing in a wafer to be supported, which is in contact with or in close proximity to the front face of the mobile holder, a charge transfer, whereby a force is produced which holds the wafer to be held on the front face of the mobile holder. Depending on the respective field configuration, positive or negative charges are generated on the surface of the wafer to be supported. It follows that a wafer held on the mobile holder has a surface charge distribution comprising essentially areas with positive and negative charges which correspond to the arrangement of the electrodes 3 and 4. In other words, an electrode 3 produces e.g. a positive charge on the surface of a wafer to be held in the area located opposite to said electrode 3, whereas the electrode 4 produces a negative charge on the surface of a wafer to be held in the area located opposite to said electrode 4. It follows that the arrangement of the electrodes 3 and 4 in segments of a circle area has the advantage that, by connecting an external voltage source, it is possible to reverse the polarity of or to disable one of the two electrodes so that a holding force can be reduced and switched off.

The wafer holder of above-described embodiment can be used in a particularly advantageous manner for dicing chips in connection with dry etching. This kind of use will be explained in the following.

The process wafer is here first prestructured with trenches for dicing the chips on the front face of the process wafer. In order to permit a removal of diced chips, the trench structure must correspond to the arrangement of the electrodes. In other words, the above-described embodiment of a mobile holder with an electrode arrangement in quarter circular segments can be used for dicing a wafer into quarter-circular-segment chips, the structured trenches subdividing the wafer into quarter circular segments.

The depth of the structured trenches is chosen in accordance with the desired residual thickness of the wafer, which the wafer is intended to have after a thinning and dicing process; in the case of e.g. thin film chips, this residual thickness is in the range of from 40 to 80 µm.

For producing thin chips, the thinning process is first carried out in the usual way, e.g. by grinding and stress-relief etching, until a thickness of approx. 100 µm has been reached. The prestructured trenches are still closed at that time. Subsequently, the wafer is subjected to a thinning process executed e.g. in a vacuum plasma chamber. The wafer can be transported into the plasma chamber either with the mobile holder or with a known holding device and in said plasma chamber it can be fixed to a stationary holding device, such as an electrostatic chuck.

Alternatively, the wafer may also remain on the mobile holder for carrying out the thinning in the vacuum plasma chamber.

In the plasma chamber, the wafer is then thinned by dry etching the back until the desired thickness of approx. 40 to 80 µm has bee reached, whereby the trenches are opened from the back. By opening the trenches, the wafer will automatically be diced into individual chips. Following this, the mobile holder, which can be kept e.g. in a rack in the vacuum plasma chamber, is fixed to a movable support, e.g. a robot wafer support. The fixing to a suitable support can be carried out easily, since the mobile holder has essentially the shape and the size of a wafer, the support seizing the holder e.g. at the edge or the margin of the holder.

Subsequently, the front face of the mobile holder is moved into close proximity to the diced chips so that the segment portions of the first electrode 3 and of the second electrode 4 are located in opposed relationship with the respective chips. For effecting a precise alignment a suitable adjusting device can be used. Furthermore, sensors can be provided on the mobile support so as to allow exact alignment with respect to the chips.

Following this, the stationary electrostatic chuck releases the diced chips, which are then taken up by the mobile holder. The mobile holder is then transported to a discharge location by the movable support. At the discharge location, the diced chips attached to the mobile holder are selectively removed from said mobile holder by reversing the polarity of electrode 3 or electrode 4.

The polarity of the electrodes is reversed by applying a polarity-reversal voltage with opposite polarity to the connecting area of the respective electrode. If, for example, the polarity of electrode 3 is reversed, the surface charge in chips located opposite to said electrode 3 will be diminished, whereby the holding force will be reduced and the respective chips will be detached from the mobile holder when a lower limit of the holding force has been reached.

The wafer having a thickness of approx. 100 µm is then fixed to the mobile holder in such a way that the quarter circular segments of the wafer, which correspond to the chips to be diced, are located in opposed relationship with the quarter circular segments of the electrodes 3 and 4 of the mobile holder.

The described embodiment of the present invention provides the possibility of selectively detaching two of the four quarter-circular-segment chips by reversing the polarity of one of the two electrodes. In order to permit a selective detachment of each of the four quarter-circular-segment chips, an electrode structure of four separate quarter-circular-segment electrodes is provided in the case of a further embodiment, each of these quarter-circular-segment electrodes being provided with a connecting area for applying a voltage. First, the electrodes are activated by switching the leads in a suitable manner during the activation according to the embodiment of FIG. 2, so that two respective diagonally opposed electrodes will have the same polarity. When the chips have been taken up, one or a plurality of the quarter-circular-segment chips can be detached selectively by purposefully reversing the polarity of the four quarter-circular-segment electrodes, whereas the rest of the quarter-circular-segment chips is still held by the mobile holder. The concept of independent electrodes, which define in the above-described embodiment an electrode structure in the form of a 2×2 matrix, can, in a further embodiment, be extended to a larger number of electrodes which are arranged in a matrix having m columns and n lines.

By providing the electrode structure in the form of a matrix, individual chips can be removed "pixelwise" by reversing the polarity of respective electrodes of the matrix. In this embodiment, the mobile holder can be used for dicing a plurality of chips from a wafer.

Furthermore, the mobile holder according to the present invention can be used for selectively taking up diced chips from a plurality of chips by controlling the connection voltages in a suitable manner.

The invention claimed is:

1. A mobile holder for a wafer, comprising:
   a base element;
   a first fixing means for electrostatically fixing the wafer to the base element, said first fixing means comprising:
   a functional layer including a charge storage layer;
   an insulating cover arranged on top of said functional layer, said wafer being in contact with said insulating cover, when said wafer is fixed to said mobile holder; and
   an electrode structure comprising a first electrode and a second electrode, each electrode having a connecting area for connecting said electrode structure to electric leads, wherein the first and the second electrodes are arranged on top of the base element and below the functional layer,
   wherein the functional layer is formed such that the first fixing means is in an electrostatically active state without any supply of voltage from outside after applying a voltage to said connecting areas, said electrostatically active state being such that a wafer is held at said mobile holder due to charges stored in said charge storage layer without any supply of voltage from outside; and a second fixing means for releasably fixing the mobile holder to a wafer support.

2. A mobile holder according to claim 1, wherein the electrode structure comprises more than two electrodes.

3. A mobile holder according to claim 2, wherein the more than two electrodes are arranged in a matrix.

4. A mobile holder according to claim 1, wherein the connecting areas are fixed to an area of said first fixing means that corresponds to a flat section of a wafer held by said mobile holder.

5. A mobile holder according to claim 4, wherein the base element has a front face and a back, the front face having arranged thereon the first fixing means, and the front face of said base element having arranged thereon said connecting area.

6. A mobile holder according to claim 1, wherein the base element has a front face and a back, the front face having arranged thereon, the first fixing means, and the back of said base element having arranged thereon said connecting area, said base element comprising a feed-through lead for connecting the connecting area to the electrode structure.

7. A mobile holder according to claim 1, wherein the functional layer consists of borosilicate glass, barium titanate or strontium titanate.

8. A mobile holder according to claim 1, wherein the base element consists of a semi-conductor material, or ceramics.

9. A mobile holder according to claim 1, wherein the base element has a front face and a back, the front face having arranged thereon the first fixing means and the back of the base element being implemented as an area and representing the second fixing means so that the mobile holder is adapted to be releasably connected to a vacuum chuck as a wafer support.

10. A mobile holder according to claim 1, which comprises as a second fixing means a marginal area into which a wafer held by the first fixing means does not project, said marginal area being implemented for fixing to the wafer support.

11. A mobile holder according to claim 1, wherein the base element comprises as a second fixing means an edge which is implemented such that the mobile holder is adapted to be releasably fixed by the wafer support simply by means of pressure contact between the wafer support and said edge.

12. A mobile holder according to claim 1, which comprises a front face and a back, the front face being adapted to have the wafer attached thereto and the back being implemented as a second fixing means for fixing to an electrostatic chuck as a wafer support.

13. A mobile holder according to claim 1, which has a shape of such a nature that it is adapted to be stored in wafer storage devices.

14. A method of handling a wafer comprising the following steps:

providing a mobile holder for a wafer, said mobile holder comprising a base element, a first fixing means used for electrostatically fixing the wafer to the base element and a second fixing means for releasably attaching the mobile holder to a wafer support, said first fixing means comprising: a functional layer including a charge storage layer; an insulating cover arranged on top of said functional layer, said wafer being in contact with said insulating cover, when said wafer is fixed to said mobile holder; and an electrode structure comprising a first electrode and a second electrode, each electrode having a connecting area for connecting said electrode structure to electric leads, wherein the first and the second electrodes are arranged on top of the base element and below the functional layer, wherein the functional layer is formed such that the first fixing means is in an electrostatically active state without any supply of voltage from outside after applying a voltage to said connecting areas, said electrostatically active state being such that a wafer is held at said mobile holder due to charges stored in said charge storage layer without any supply of voltage from outside;

fixing the mobile holder to a wafer support with the aid of the second fixing means;

attaching a wafer to the base element with the aid of the first fixing means;

moving the mobile holder from a first location to a second location; and detaching the wafer from the mobile holder by actuating the first fixing means.

* * * * *